US010074960B2

(12) United States Patent
Almonte et al.

(10) Patent No.: US 10,074,960 B2
(45) Date of Patent: Sep. 11, 2018

(54) PREDICTIVE MODIFICATION OF LASER DIODE DRIVE CURRENT WAVEFORM IN ORDER TO OPTIMIZE OPTICAL OUTPUT WAVEFORM IN HIGH POWER LASER SYSTEMS

(71) Applicant: NLIGHT, INC., Vancouver, WA (US)

(72) Inventors: Kenneth V. Almonte, Portland, OR (US); Qi Wang, Sunnyvale, CA (US)

(73) Assignee: NLIGHT, INC., Vancouver, WA (US)

( * ) Notice: Subject to any disclaimer, the term of this patent is extended or adjusted under 35 U.S.C. 154(b) by 0 days.

(21) Appl. No.: 15/359,273

(22) Filed: Nov. 22, 2016

(65) Prior Publication Data

US 2017/0149207 A1     May 25, 2017

Related U.S. Application Data

(60) Provisional application No. 62/258,774, filed on Nov. 23, 2015.

(51) Int. Cl.
| | |
|---|---|
| *H01S 5/04* | (2006.01) |
| *H01S 5/042* | (2006.01) |
| *H01S 3/067* | (2006.01) |
| *H01S 3/094* | (2006.01) |
| *H01S 3/0941* | (2006.01) |
| *H01S 3/13* | (2006.01) |

(52) U.S. Cl.
CPC .............. *H01S 5/042* (2013.01); *H01S 3/067* (2013.01); *H01S 3/09415* (2013.01); *H01S 3/094003* (2013.01); *H01S 3/1305* (2013.01)

(58) Field of Classification Search
CPC .... H01S 5/042; H01S 3/067; H01S 3/094003; H01S 3/09415; H01S 3/1305
See application file for complete search history.

(56) References Cited

U.S. PATENT DOCUMENTS

| | | |
|---|---|---|
| 3,388,461 A | 6/1968 | Lins |
| 4,713,518 A | 12/1987 | Yamazaki |
| 4,863,538 A | 9/1989 | Deckard |
| 5,008,555 A | 4/1991 | Mundy |

(Continued)

FOREIGN PATENT DOCUMENTS

| | | |
|---|---|---|
| CN | 1217030 C | 8/2005 |
| CN | 926460 | 3/2007 |

(Continued)

OTHER PUBLICATIONS

USPTO; International Search Report and Written Opinion for PCT/US16/63396; dated Feb. 14, 2017; 10 pages.

(Continued)

*Primary Examiner* — Armando Rodriguez
(74) *Attorney, Agent, or Firm* — Schwabe, Williamson & Wyatt P.C.

(57) ABSTRACT

In an example, a laser system receives an externally generated single command. The single command may be selected from a set of commands usable to control a laser diode driver of the laser system. The laser system may determine whether to select a group of one or more commands from the set of commands. In response to a determination to select the group of the one or more commands from the set of commands, the laser diode driver may be controlled using the one or more commands of the group.

25 Claims, 7 Drawing Sheets

(56) References Cited

U.S. PATENT DOCUMENTS

| | | |
|---|---|---|
| 5,252,991 A | 10/1993 | Storlie |
| 5,509,597 A | 4/1996 | Laferriere |
| 5,523,543 A | 6/1996 | Hunter |
| 5,932,119 A | 8/1999 | Kaplan |
| RE37,585 E | 3/2002 | Mourou |
| 6,362,004 B1 | 3/2002 | Noblett |
| 6,426,840 B1 | 7/2002 | Partanen |
| 6,490,376 B1 | 12/2002 | Au et al. |
| 6,557,314 B2 | 6/2003 | Yoshida |
| 6,577,314 B1 | 6/2003 | Yoshida et al. |
| 7,349,123 B2 | 3/2008 | Clarke |
| 7,781,778 B2 | 8/2010 | Moon |
| 8,071,912 B2 | 12/2011 | Costin |
| 8,237,788 B2 | 8/2012 | Cooper et al. |
| 8,251,475 B2 | 8/2012 | Murray |
| 8,269,108 B2 | 9/2012 | Kunishi |
| 8,310,009 B2 | 11/2012 | Saran |
| 8,414,264 B2 | 4/2013 | Bolms |
| 8,442,303 B2 | 5/2013 | Cheng et al. |
| 8,472,099 B2 | 6/2013 | Fujino |
| 8,809,734 B2 | 8/2014 | Cordingley |
| 2003/0213998 A1 | 11/2003 | Hsu |
| 2004/0112634 A1 | 6/2004 | Tanaka |
| 2004/0207936 A1 | 10/2004 | Yamamoto |
| 2005/0168847 A1 | 8/2005 | Sasaki |
| 2005/0233557 A1 | 10/2005 | Tanaka |
| 2006/0275705 A1 | 12/2006 | Dorogy |
| 2008/0246024 A1 | 10/2008 | Touwslager |
| 2009/0122377 A1 | 5/2009 | Wagner |
| 2009/0213879 A1 | 8/2009 | Stadler |
| 2009/0274833 A1 | 11/2009 | Li |
| 2009/0314752 A1 | 12/2009 | Manens |
| 2010/0025387 A1 | 2/2010 | Arai |
| 2010/0207543 A1 | 8/2010 | Crawford |
| 2010/0225974 A1 | 9/2010 | Sandstrom |
| 2010/0230665 A1 | 9/2010 | Verschuren |
| 2011/0080476 A1 | 4/2011 | Dinauer |
| 2011/0127697 A1 | 6/2011 | Milne |
| 2011/0279826 A1 | 11/2011 | Miura |
| 2012/0127097 A1 | 5/2012 | Gaynor |
| 2012/0145685 A1 | 6/2012 | Ream |
| 2012/0148823 A1 | 6/2012 | Chu |
| 2012/0156458 A1 | 6/2012 | Chu |
| 2012/0278277 A1 | 11/2012 | Marathe et al. |
| 2012/0295071 A1 | 11/2012 | Sato |
| 2012/0301733 A1 | 11/2012 | Eckert |
| 2012/0301737 A1 | 11/2012 | Labelle |
| 2013/0005139 A1 | 1/2013 | Krasnov |
| 2013/0022754 A1 | 1/2013 | Bennett |
| 2013/0023086 A1 | 1/2013 | Chikama |
| 2013/0027648 A1 | 1/2013 | Moriwaki |
| 2013/0095260 A1 | 4/2013 | Bovatsek |
| 2013/0228442 A1 | 9/2013 | Mohaptatra |
| 2014/0104618 A1 | 4/2014 | Potsaid |
| 2014/0155873 A1 | 6/2014 | Bor |
| 2014/0263971 A1* | 9/2014 | Karlsen ............... G01J 1/4257 250/208.2 |
| 2014/0269799 A1 | 9/2014 | Ortiz |
| 2014/0332254 A1 | 11/2014 | Pellerite |
| 2014/0333931 A1 | 11/2014 | Lu |
| 2015/0165556 A1 | 6/2015 | Jones |
| 2015/0352664 A1 | 12/2015 | Errico |
| 2016/0158889 A1 | 6/2016 | Carter |
| 2016/0187646 A1 | 6/2016 | Ehrmann |

FOREIGN PATENT DOCUMENTS

| | | |
|---|---|---|
| CN | 101836309 | 10/2007 |
| CN | 101303269 | 11/2008 |
| CN | 101314196 | 12/2008 |
| CN | 102448623 | 3/2009 |
| CN | 101733561 | 6/2010 |
| CN | 201783759 | 4/2011 |
| CN | 102176104 | 9/2011 |
| CN | 102441740 | 5/2012 |
| DE | 20320269 | 4/2004 |
| EP | 2587564 | 5/2013 |
| JP | H02220314 | 9/1990 |
| JP | 2006106227 | 4/2006 |
| JP | 2008281395 | 11/2008 |
| RU | 2008742 | 8/1994 |
| TW | 200633062 | 9/2006 |
| TW | 200707466 | 2/2007 |
| WO | 1995011100 | 4/1995 |
| WO | 1995011101 | 4/1995 |
| WO | 2012102655 | 8/2012 |
| WO | 2017091606 | 6/2017 |

OTHER PUBLICATIONS

Affine Transformation-from Wolfram MathWorld; http://mathworld.wolfram.com/AffineTransforation.html; downloaded Feb. 21, 2014; 2 pages.

Java-Transform a triangle to another triangle-Stack Overflow; http://stackoverflow.com/questions/1114257/transform-a-triangle-to-another-triangle?Iq=1; downloaded Feb. 21, 2014; 3 pages.

Chung; "Solutions-Processed Flexible Transparent Conductors Composed of Silver Nanowire Networks Embedded in Indium Tin Oxide Nanoparticle Matrices"; Nano Research, Sep. 24, 2012, 10 pages.

Gardner; "Precision Photolithography on Flexible Substrates"; http://axorescorp.com/downloads/Article/AsonresFlexSubstrate.pdf ; (prior to Jan. 30, 2013).

Grigoriyants; "Tekhnologicheskie protsessy lazernoy obrabotki"; Moscow isdatelstvo MGTU im N.E. Baumana, p. 334 (2206).

Product Brochure entitle "3-Axis and High Power Scanning" by Cambridge Technology, 4 pages, downloaded Dec. 21, 2013.

Product Brochure entitled "Theory of Operation" by Cambridge Technology; 4 pages downloaded Dec. 21, 2013.

3-Axis Laser Scanning Systems; downloaded from http://www.camtech.com/index.php?option=com_content&view=artile&id=131&Itemid=181;4 pages; Dec. 31, 2014.

Giannini et al.; "Anticipating, Measuring, and Minimizing Mems Mirror Scan Error to Improve Laser Scanning Microscopy's Speed and Accurancy"; PLOS ONE; Oct. 3, 2017; 14 pages.

Kummer et al.; "Method to Quantify Accuracy of Position of Feedback Signals of a Three-Dimensional Two-photon Laser-scanning Microscope"; Biomedical Optics Express, 6(10); Sep. 1, 2015; 3678-3693.

PC1-6110; Multifunction I/O device, http://www.ni.com/en-us-support/odel.pci6110.html; downloaded Dec. 15, 017; 1 page.

\* cited by examiner (Background)

US 10,074,960 B2

PREDICTIVE MODIFICATION OF LASER DIODE DRIVE CURRENT WAVEFORM IN ORDER TO OPTIMIZE OPTICAL OUTPUT WAVEFORM IN HIGH POWER LASER SYSTEMS

CROSS REFERENCE TO RELATED APPLICATION

This application claims the benefit of U.S. Provisional Application No. 62/258,774, filed Nov. 23, 2015, which is incorporated herein by reference in its entirety.

TECHNICAL FIELD

The present disclosure relates to diode laser power systems.

BACKGROUND

Referring now to FIG. 1, some fiber laser systems 19 include a laser diode driver 25 controlling the current into a laser diode 26, which outputs photons of a particular wavelength in response to the electrical current applied to the laser diode 26. The laser system 19 may also include wavelength conversion optics 27 that output a different wavelength of photons in response to input photons of a certain wavelength. The laser system 19 may include other components such as circuitry (not shown) for output power calibration.

The laser system 19 may be controlled by an external application controller 11, which may be any customer equipment to control the laser system 19 (e.g., a beam positioning system, laser scanner system, logic controller, a networked computer, etc.). The external application controller 11 may command the laser system 19 to output particular magnitudes of laser output power at precise times. At a given time, the application controller 11 may select a single command 21 of a set of supported commands 28 of the laser diode driver 25. The laser diode driver 25 controls current based on the single command 21, which causes the laser system 19 to generate the laser output 29.

BRIEF DRAWINGS DESCRIPTION

The accompanying drawings, wherein like reference numerals represent like elements, are incorporated in and constitute a part of this specification and, together with the description, explain the advantages and principles of the presently disclosed technology.

Figure 2:
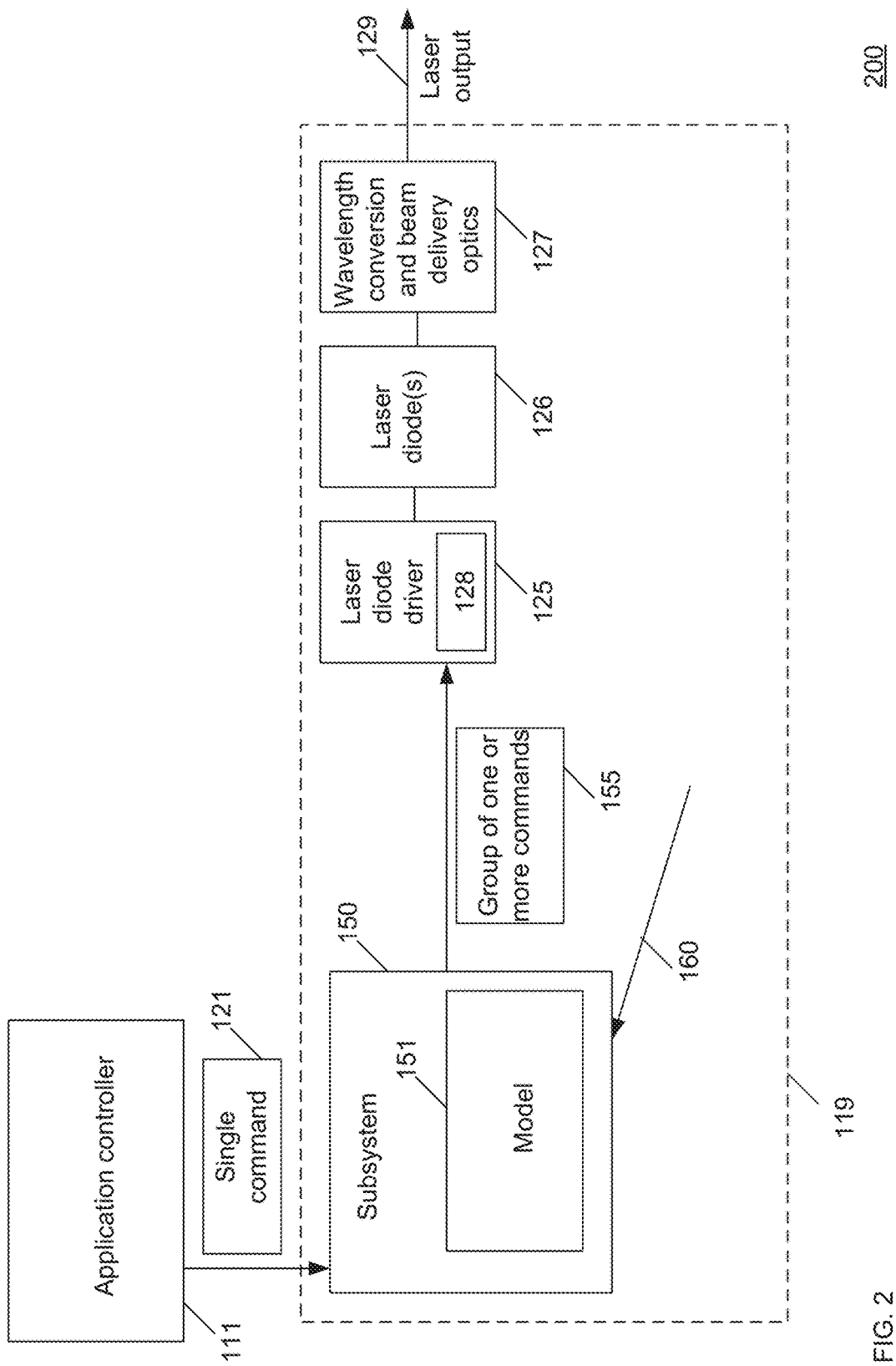
FIG. 2 illustrates a laser system configured for predictive modification of laser diode driver current waveform.
Figure 4A:
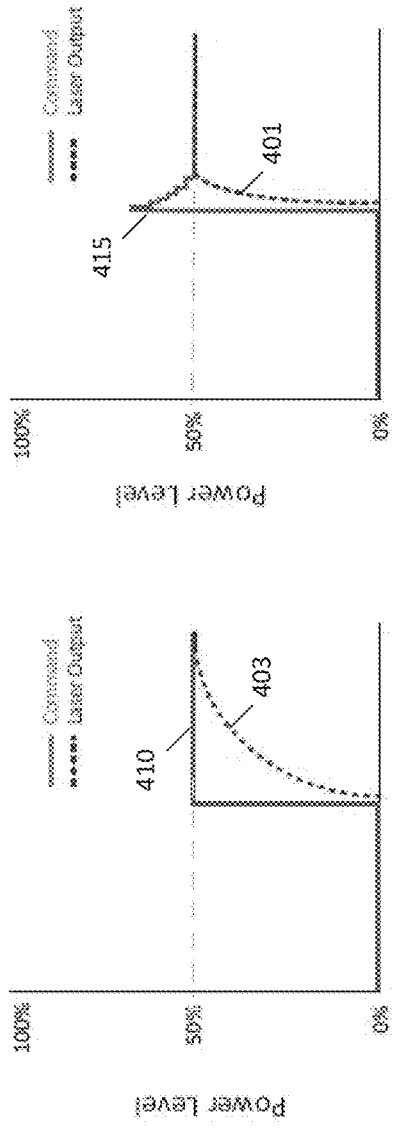
Figure 4B:
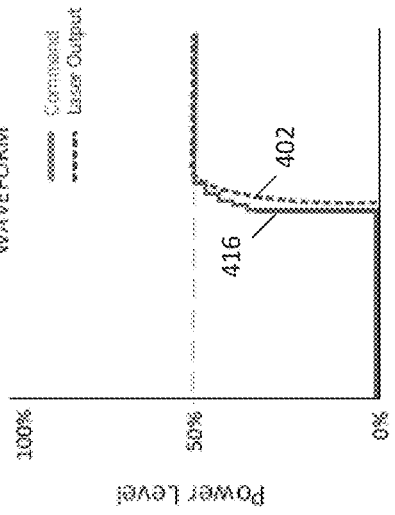
Figure 4B:
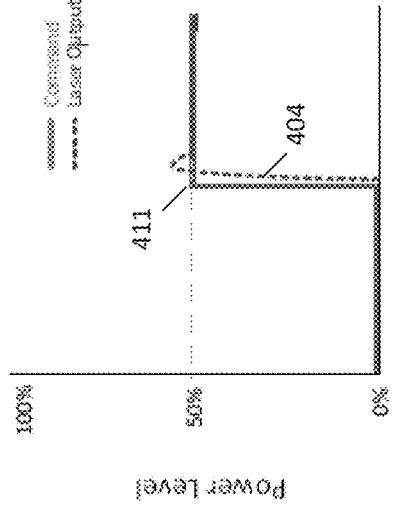

FIGS. 4A-B illustrate a comparison of laser output for a conventional command and the laser output of FIG. 2.

Figure 5:
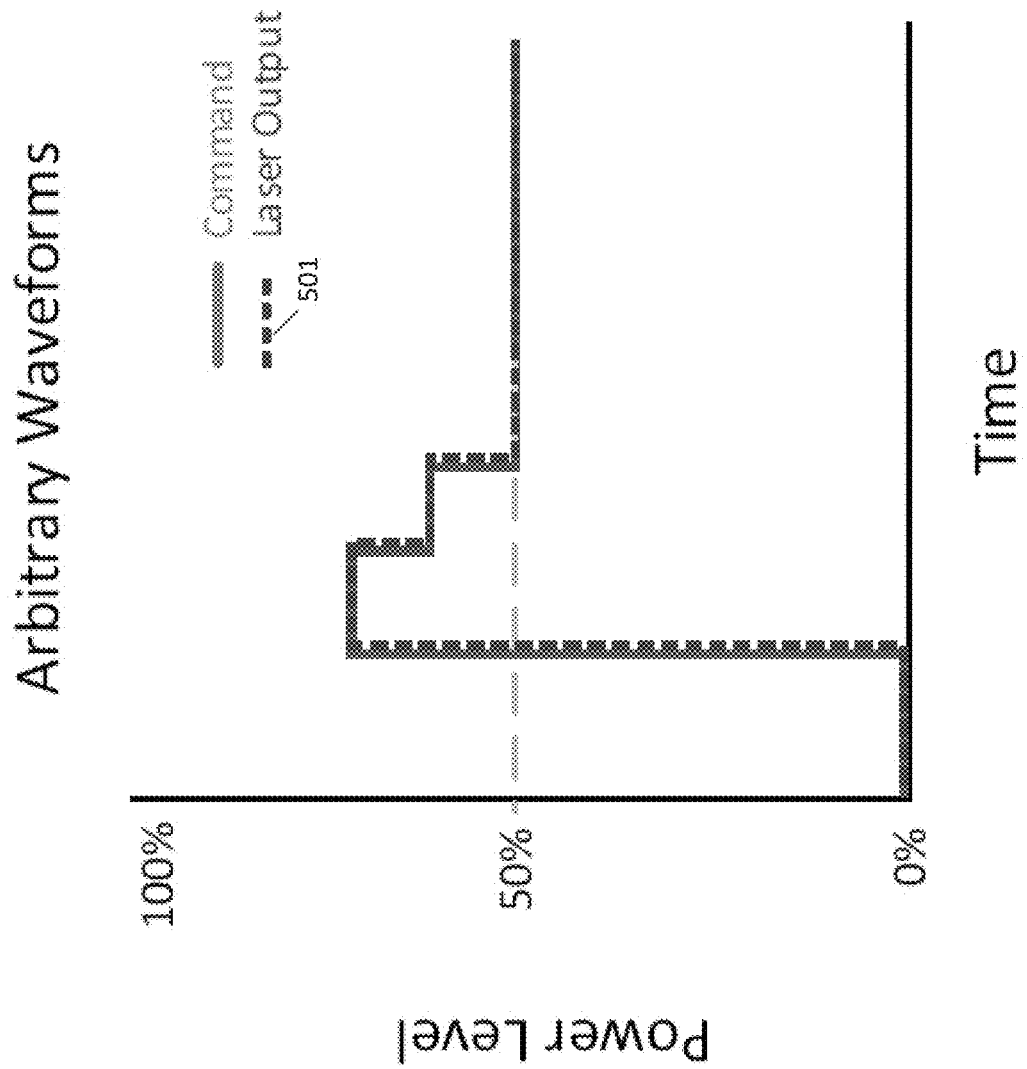

FIG. 5 illustrates an example waveform that may be generated by the system of FIG. 2.

Figure 6:
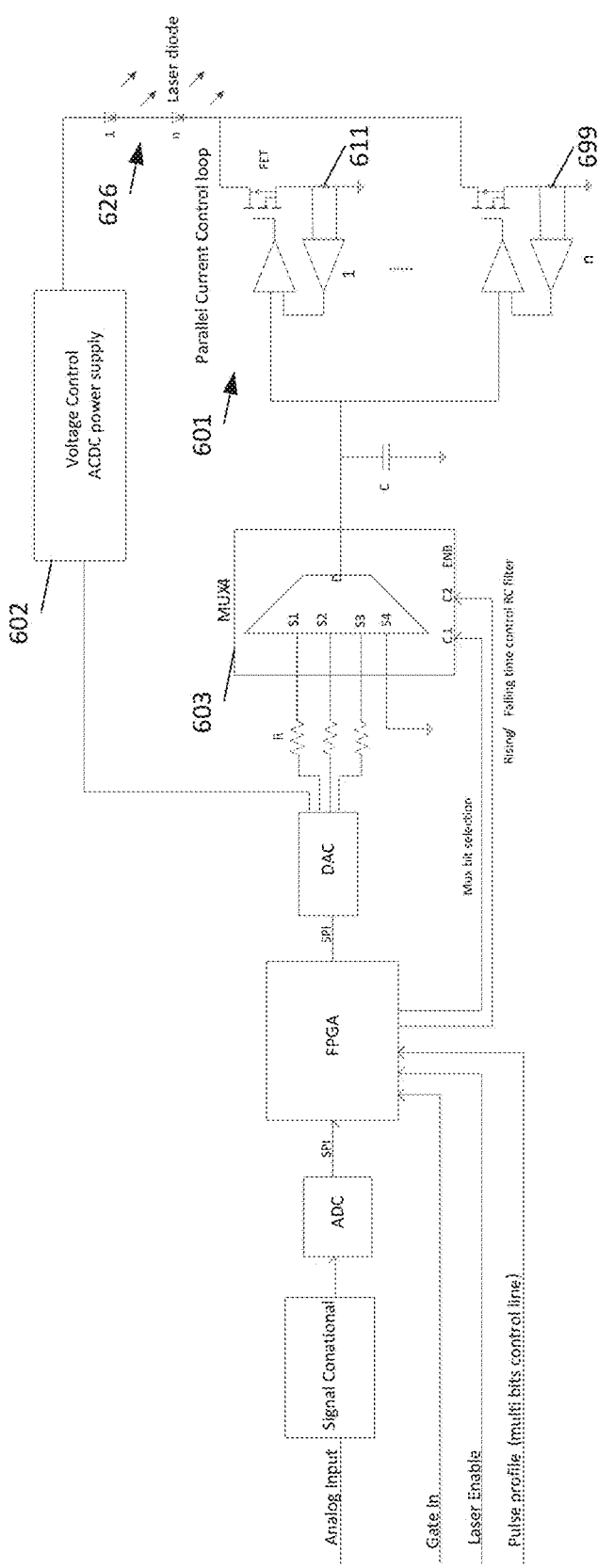

FIG. 6 illustrates an example circuitry of a laser system of FIG. 2, in some embodiments.

Figure 7:
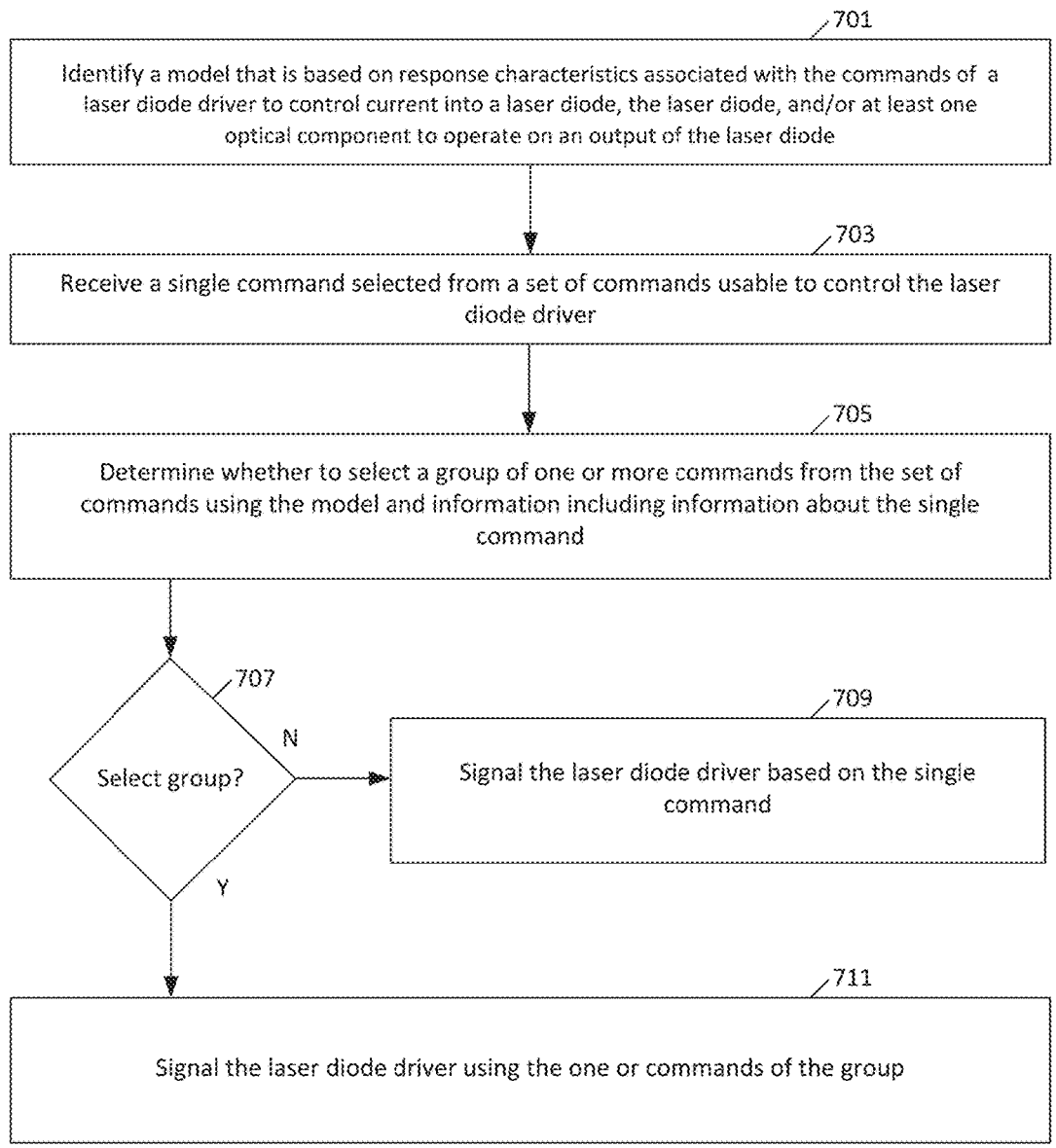

FIG. 7 illustrates a process that may be performed by the processing device of the subsystem of the laser system of FIG. 2, in some embodiments.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another.

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus.

Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation. In some disclosed examples, laser diodes, laser diode arrays, and laser diode drivers receive or provide drive currents that can vary in magnitude, duration, and frequency so that laser diode operation can be controlled. Such variations of laser drive parameters can be specified and distributed using one or more microcontrollers or other integrated circuits that provide digital control signals produced in response to predetermined values or established by a user. In other examples, laser drive values are established using analog circuit components such as voltage dividers or other networks. For convenience, both analog and digital devices that accomplish control of laser diode currents are referred to herein as controllers or control circuits.

Fiber laser systems, particularly in applications where a laser beam interacts with a material to do work, are commanded by an application controller to trigger a laser at a precise instant to output a precise power level in tight coordination with external laser beam positioning components. In response to such commands, internal control electronics within the laser system are to control the current to one or more laser diodes in a way that is proportional to the power command coming in from the application controller. Typical timescales for this type of control range from tens of microseconds to hundreds of milliseconds or more, with changes in output power levels ranging from 0 to 100%.

Figure 1:
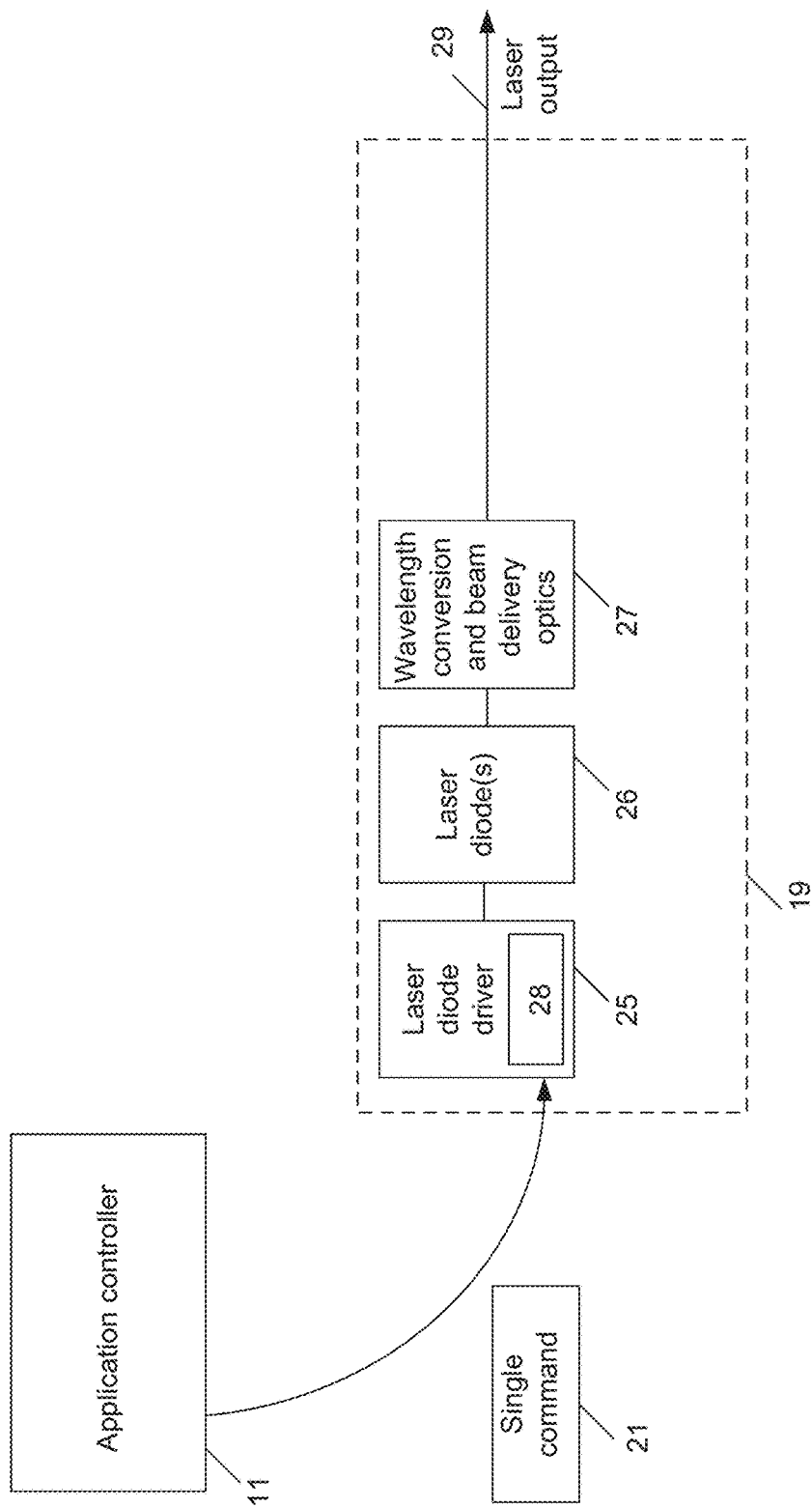
FIG. 1 illustrates an example of a laser system.

Non-ideal, non-linear performance characteristics of the laser system 19 of FIG. 1 may result in an optical output power waveform of the laser output 29 that does not exactly follow the commanded shape of the electrical current waveform in both magnitude and time. In applications where the dynamics of the optical output power waveform are important, this non-linear behavior may degrade the effectiveness of the laser output 29 for that application. Additionally, in a fast modulation (100 KHZ) high power (>1 KW) electrical-optical system, the inductance of the cable and laser diode itself can cause a big overshoot and undershoot when the driving current changes quickly. The large overshoot and undershoot can permanently damage the laser diode 26. The high current driver circuit itself can easily overheat which cause reliability failures.

An example laser system for predictive modification of a laser diode driver current waveform may solve these and other problems. Knowing how each internal laser component contributes to the overall dynamic performance of a given laser system, a performance model can be made, both by mathematical and empirical methods. In applications where a particular optical output waveform is desired, the model can be worked in reverse to determine what electrical command to the laser diode driver would produce the desired result. In practice, by "pre-compensating" the electrical current command to the laser diode driver to account for the non-linear, non-ideal performance of the downstream components, the desired optical output waveform can be created.

One of the benefits of such a laser system lies within the timescales mentioned earlier. When a typical laser is commanded to change current from, for example, 0% to 50%, a single command is sent to the laser diode driver to set the new diode current set point to 50%. The laser diode driver itself will have a certain response characteristic to this command to change the current. In turn, the laser diode will respond to the change in current with a characteristic rate of change of output photons. Finally, the wavelength and beam conversion optics will have a natural output response to the change of input optical power.

However, if it were possible to know how the downstream electrical and optical components would respond to the requested change in laser output power, the command sent to the laser diode driver could be adjusted in order to compensate for non-linear behavior of downstream components to achieve a certain optimization on the laser output.

In some examples, a laser system may include 1) a laser diode driver capable of changing the laser diode current on a faster scale than the laser power can be commanded by the application controller, 2) circuitry to receive or create a digital representation of the output power command from the application controller, 3) digital processing capability to compute what the next current command to the laser diode driver is to be based on the present operating conditions and the requested output laser power using a computable electro-optical model of the laser system, and 4) circuitry to quickly communicate the change in laser diode current to the laser diode driver.

To command the laser to change its output power from 0% to 50%, a laser system may not have to simply command the laser diode driver to go directly to 50%. The laser system could instead rapidly program a specific sequence of multiple steps in the laser diode current to make the laser output power get to 50% as quickly as possible, for example. Or the laser system could rapidly program a specific sequence of steps in the laser diode current to slow down the rate at which the laser output achieves 50% to minimize power overshoot, for example. The sequence, duration, and level of the current program steps would be varied depending on the laser parameters that are desired to be optimized. Examples of parameters to optimize are current rise time, fall time, overshoot, and undershoot.

It should be noted that in addition to optimizing the aforementioned parameters evident during laser turn-on and turn-off, the architecture described above can also be used to generate optical output power waveforms of an arbitrary shape. The arbitrary shape could be controlled by the internal laser electronics by running through a sequence of pre-programmed laser diode driver current commands that are sent to the laser diode driver at pre-programmed intervals. Alternately, the application controller could digitally command the internal laser control electronics to immediately set the laser diode current at the diode driver to a particular level, and then at another time, set the laser diode current at the diode driver to a different level, therefore constructing a sequence on-the-fly. An alternate embodiment could use an analog input to the laser control electronics to receive a power level command from the application controller. An analog-to-digital converter between this input and the internal laser control electronics quickly converts the analog voltage to a digital command that can then be sent to the laser diode driver to change the diode current to the desired level. The speed at which the analog-to-digital converter can convert the input analog voltage from the application controller is a contributing factor to the timing resolution available to construct an arbitrary waveform from an analog input voltage. The use of a digital input from the application controller is not limited by an analog-to-digital converter and its conversion speed, but will be limited by digital processing power and the speed at which the laser diode driver can receive laser diode current commands and react to them. Some examples may include a fast digital communication bus from the laser diode driver to the internal laser controller, as well as a fast communication bus from the internal laser digital controller to the analog-to-digital converter sampling the analog power control input.

Unlike some methods of optimizing laser pulse shape, processes described herein may not require real time feedback of the shape of the optical pulse. Such capability can add expense to the laser system. Simple sensors such as temperature sensors or photodiodes for average power measurement can be used as inputs to the computable laser model, if necessary.

FIG. 2 illustrates a laser system 119 configured for predictive modification of laser diode driver current waveform. The laser system 119 includes subsystem 150, which may include a memory to store a model 151 and a processing device. The subsystem 150 may intercept the single command 121 and the processing device may utilize the model 151 and information (for example information about the single command 121) to ascertain whether to adjust for dynamic, non-linear characteristics related to the laser diode driver 125, laser diode 126, and/or wavelength conversion and delivery optics 127, or not. By adjusting for these dynamic, non-linear characteristics, the laser system 119 may generate a laser output 129 that more closely follows the commanded shape of the electrical current waveform in both magnitude and time than the laser output 29 (FIG. 1).

The processing device of the subsystem 150 may determine to select a group 155 of one or more commands to signal to the laser diode driver 125. The group 155 may be only a single different command or may include a sequence of more than one command (it should be appreciated that a sequence may or may not include the same command as the single command 121). Commands of a sequence may be for execution by the laser diode driver 125 at different times. In some examples, the processing device may be configured to signal the laser diode driver 125 at a first time using a first command of the group 155, to wait an amount of time, and to signal the laser diode driver 125 after waiting the amount of time at a second different time using a second command from the group 155. The processing device may be configured to select the amount of time using the model 151. The amount of time may be no greater than a smallest amount of time that the application controller is capable of delivering a next single command to the processing device.

The model 151 may be based on response characteristics of any component of the laser system 119. These response characteristics may be for the commands of the set 128 of commands. Also, in some examples, the model 151 may be based on a relationship of the response characteristics for the commands of the set 128 as a function of an operation characteristic (e.g., temperature, power level, optical measurement, etc.) of a component of the laser system 119. In such examples, the laser system 119 may include one or more sensors (not shown) to provide measurements of the operating characteristics. The information utilized by the processing device of the subsystem 150 for the determination of whether to select the group 155 of one or more commands may include a measurement 160 of the sensors.

In some examples, the subsystem 150 may be configured to pass the single command 121 to the laser diode driver in response to a determination to not select any group of one or more commands. In such cases, a component(s) of the laser system 119 and/or the subsystem 150 the first single command 121 from the application controller 111 may be digitally processed before a signal (not shown) is sent to the laser diode driver 125. The signal processing may include simple offset and gain coefficients for the purpose of output power calibration.

In some examples, the processing device of the subsystem 150 may be configured to select the group of the one or more commands based on a response time of the laser diode driver. The processing device may select a first group if the response time of the laser diode driver is not faster than a threshold, and may select a second different group (e.g., with at least one additional command and/or a different command) if the response time of the laser diode driver is faster than the threshold.

In an example, a laser system receives an externally generated single command. The single command may be selected from a set of commands usable to control a laser diode driver. The laser system may determine whether to select a group of one or more commands from the set of commands. In response to a determination to select the group of one or more commands from the set of commands, the laser diode driver may be controlled using the one or more commands of the group.

FIG. 7 illustrates a process 700 that may be performed by the processing device of the subsystem 150 of the laser system 119 of FIG. 2, in some embodiments. In block 701, the processing device may identify a model that is based on response characteristics associated with the components of a laser diode driver to control current into a laser diode, the laser diode, and/or at least one optical component to modify on an output of the laser diode. In block 703, the processing device may receive a single command selected from a set of commands usable to control the laser diode driver. In block 705, the processing device may determine whether to select a group of one or more commands from the set of commands using the model and information including information about the single command. The information used by the processing device may include sensor data in some examples. The information used by the processing device may include information about the laser diode driver, such as response time information, in some examples.

If the group is selected in diamond 707, then in block 711 the processing device may signal the laser diode driver using the one or more commands of the group. If the group is not selected in diamond 707, then in block 709 the processing device may signal the laser diode driver based on the single command.

Figure 3:
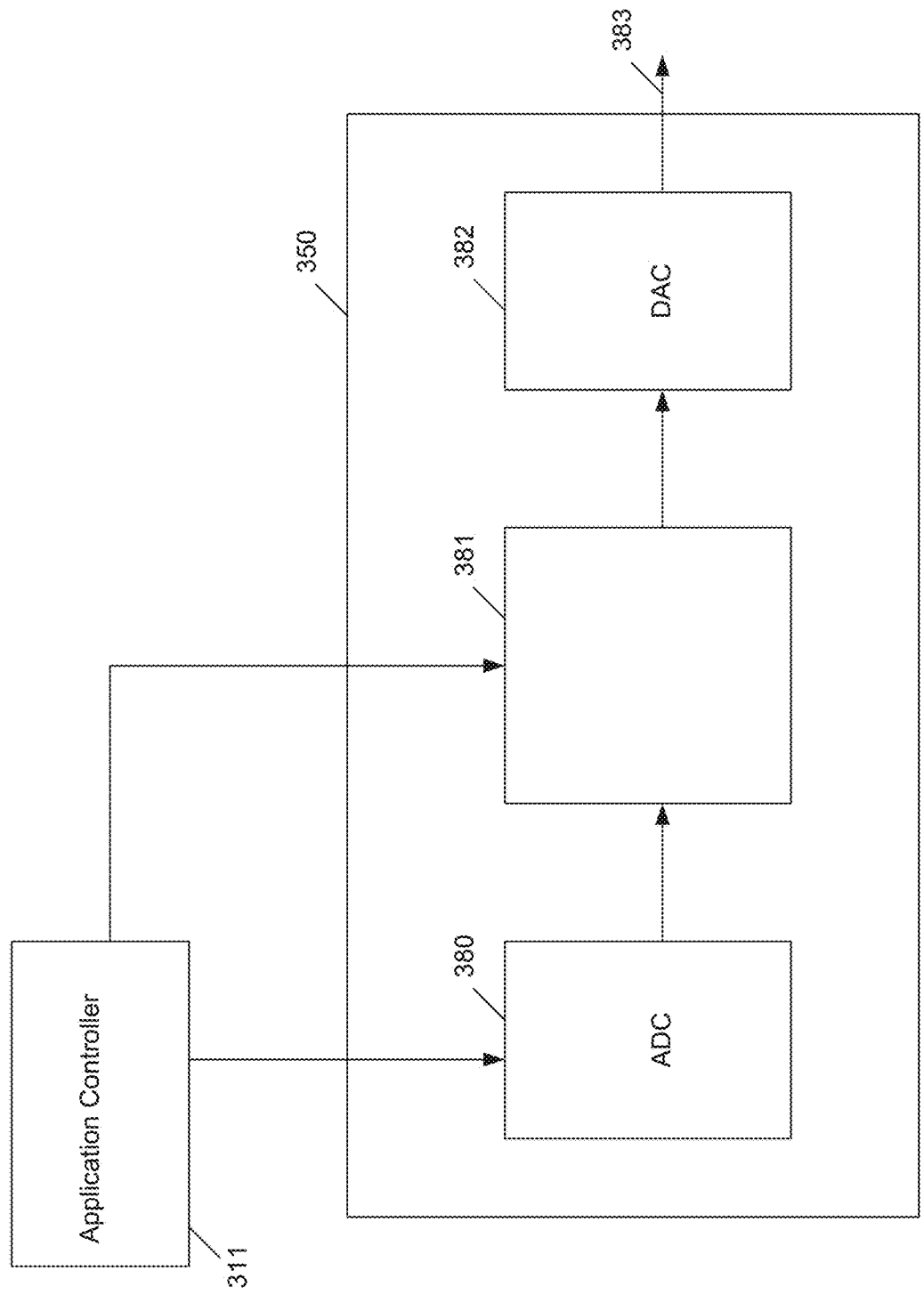
FIG. 3 illustrates a block diagram of components of a subsystem similar to the subsystem of the laser system of FIG. 2, in some embodiments.

FIG. 3 illustrates a block diagram of components of a subsystem 350 similar to the subsystem 150 of the laser system of FIG. 2, in some embodiments. A communication from the application controller 311 may include an analog and/or a digital signal. For example, as mentioned earlier, an alternate embodiment could use an analog input to the laser system to receive a power level command from the application controller 311. An analog-to-digital converter 380 between this input and the internal laser control electronics 381 quickly converts the analog voltage to a digital command that can then be sent to the laser diode driver to change the diode current to the desired level. Internal laser control electronics 381 may be similar to components of the subsystem 150 (FIG. 2). The speed at which the analog-to-digital converter 380 can convert the input analog voltage from the application controller 311 is a contributing factor to the timing resolution available to construct an arbitrary waveform from an analog input voltage.

However, the use of a digital input from the application controller 311 (e.g., directly to the internal laser control electronics 381) is not limited by analog-to-digital converter conversion speed, but may still be limited by digital processing power and the speed at which the laser diode driver can receive laser diode current commands and react to them. Therefore, some embodiments may have a fast digital communication bus from the laser diode driver to the internal laser controller, as well as a fast communication bus from the internal laser digital controller 381 to the analog-to-digital converter 382 sampling the analog power control input, if such an input exists in the laser control system.

An output 383 of the subsystem 350 may be an analog signal, such as an analog voltage to control a current control loop (not shown) coupled to a cathode end of a laser diode of a laser system. As will be explained later with respect to FIG. 6, a laser system may include more than one current control loop coupled in parallel.

FIGS. 4A-B illustrate a comparison of laser output for a conventional command and the laser output of FIG. 2.

The processing device of the subsystem 150 (FIG. 2) may identify a desired optical output waveform different than an actual output waveform generatable from the single command. The group of one or more commands may correspond to the desired optical output waveform. The one or more commands may be to pre-compensate for at least one of non-linear or non-ideal performance associated with at least one of the laser diode driver, the laser diode, or the at least one optical component to produce an actual output waveform that is closer to the desired optical output waveform than the actual output waveform generatable from the single command.

The laser system 119 of FIG. 2 may produce an actual output waveform such as the examples actual output waveforms 401 and 402 that are closer to desired optical output waveforms, respectively, than the actual output waveforms 403 and 404 generatable from the single command, respectively. The examples actual output waveforms 401 and 402 match the command lines 410 and 411 sooner over time than the actual output waveforms 403 and 404 generatable from the single command, respectively. In the illustrated cases, the group of commands includes a sequence of commands for staggered execution by the laser diode driver as indicated by the step-down command lines 415 and the step-up command line 416.

FIG. 5 illustrates an example waveform 501 that may be generated by the system of FIG. 2. As mentioned previously, in addition to optimizing the aforementioned parameters evident during laser turn-on and turn-off, embodiments of the laser system described herein can also be used to generate optical output power waveforms of an arbitrary shape. The arbitrary shape could be controlled by the internal laser electronics by running through a sequence of pre-programmed laser diode driver current commands that are sent to the laser diode driver at pre-programmed intervals. Alternately, the application controller could digitally command the internal laser control electronics to immediately set the laser diode current at the diode driver to a particular level, and then at another time, set the laser diode current at the diode driver to a different level, therefore constructing a sequence on-the-fly.

Arbitrary optical waveform generation is common in various segments of the laser industry. However, the speed at which embodiments of the laser system described herein can operate is faster that previous approaches. Laser systems described herein may include a high conversion rate of the analog power input control analog-to-digital-converter, a fast communication bus to the internal laser control electronics, a fast digital processing capability of the laser control electronics, a fast communication bus between the laser control electronics and the laser diode driver, and a fast response rate of the laser diode driver itself.

FIG. 6 illustrates an example circuitry 600 of a laser system of FIG. 2, in some embodiments. The circuitry 600 uses more than one parallel current control loop 601 (e.g., "n" current control loops) and voltage controlled ACDC power supply 602 to avoid FET (Field Effect Transistor) overheat. A first one of the n parallel current control loops 601 may include a first resistor 611 (e.g., a sense resistor), and an nth one of the n parallel current control loops 601 may include an nth resistor 699 (e.g., a sense resistor). The voltage across a sense resistor may be based on the current flowing through the sense resistor.

In a laser current control loop a FET may be used to boost the current to drive a laser diode. However, different laser diodes have slight different forward voltage. When more than one laser diodes are coupled together in serial, the voltage drop across FET will be different in each case. The FET may dissipate extra heat to tolerance this voltage difference. By using the voltage control ACDC power supply, the FET voltage may be auto calibrated to get consistent heat dissipation for different laser diode configuration. Electronic efficiency may be improved by limiting the FET heat dissipation.

To prevent an individual FET from overheating and precisely control the current control precision, the circuitry 600 uses more than one parallel control loops 601 together to drive high current diode. Each FET of the more than one parallel control loops 601 may only share the portion of current (e.g., $1/n^{th}$ of the current). This may allow a different current sensor resistor value than other systems, which may be more accurate and/or less expensive. The sensor resistor accuracy may affect how precisely laser diode current may be controlled.

The circuitry 600 also illustrates the use of a MUX 603 and different low pass filter (RC) values to control the laser rising time and falling time independently. When a high current laser diode is driven with the fast rising/falling edge pulse, the inductance of the cable and laser diode may cause the big overshoot and undershoot which can permanently damage the laser diode or driver circuit. Also, because of the nature of laser diode, the laser pulse may exhibit asymmetric rising time and falling time. By using MUX 603 to set different rising and falling time, the circuitry 600 may provide flexibility to optimize the laser performance for the fast modulation. The circuitry 600 may also allow for the use of an adjustable resistor, e.g., digipot, to optimize the rise and fall time of the laser diode current.

On board fast sample rate ADC and DAC and data bus may control the laser diode current rapidly, as previously discussed. By using the gate controlled MUX 603, a user may easily combine the analog input with a gate in signal together to generate arbitrary waveform.

In some embodiments including circuitry similar to the circuitry 600, a laser diode driver may include an AC (alternating current) to DC (direct current) power supply coupled to a reference voltage and to the anode of the laser diode for voltage controls. Current control loops may be coupled in parallel to the cathode of the laser diode. Each current control loop may be coupled to the reference voltage. In some examples, the laser diode comprises a count of N diodes in series and a count of the current control loops is equal to N.

Some embodiments of a laser system may include the circuitry 600 even if the laser system does not include the subsystem 150 (FIG. 1). That is to say that the circuitry 600 may be useful for reasons including but not limited improved heat dissipation for a laser diode configuration regardless of whether the laser diode configuration uses techniques for predictive modification of laser diode driver current waveform, such as those described with respect to FIGS. 2-5. For instance, some embodiments of a laser system may be similar to FIG. 1, with the laser system including circuitry 600 or components thereof. Some embodiments of a laser system including components of the circuitry 600 may include a laser diode; and a laser diode driver to control current into the laser diode, the laser diode driver including an AC (alternating current) to DC (direct current) power supply coupled to a reference voltage and to an anode of the laser diode; and current control loops coupled in parallel to a cathode of the laser diode, wherein each current control loop is coupled to the reference voltage for diode current control.

EXAMPLES

Example 1 is an apparatus, comprising: a laser diode driver to control current into a laser diode, the laser diode driver controllable using a set of commands; a memory to store a model that is based on response characteristics associated with the commands of at least one of the laser diode driver, the laser diode, or at least one optical component to modify on an output of the laser diode; and a processing device coupled to the laser diode driver and the memory, the processing device configured to: receive a single command selected from the set of commands; determine whether to select a group of one or more commands from the set of commands using the model; and in response to a determination to select the group of the one or more commands from the set of commands, signal the laser diode driver using the one or more commands of the group.

Example 2 includes the subject matter of example 1, and the processing device is further configured to pass the single command to the laser diode driver in response to a determination to not select the group of the one or more commands.

Example 3 includes the subject matter of any of examples 1-2, and the processing device is configured to signal the laser diode driver at a first time using a first command of the group, to wait an amount of time, and to signal the laser diode driver after waiting the amount of time at a second different time using a second command from the group.

Example 4 includes the subject matter of any of examples 1-3, and the processing device is configured to select the amount of time using the model.

Example 5 includes the subject matter of any of examples 1-4, and a source of the single command is a remote processing device of an application controller, wherein the remote processing device is external to the processing device of the application controller, and wherein the amount of time is no greater than a smallest amount of time that the remote processing device of the application controller is capable of delivering a next single command to the processing device.

Example 6 includes the subject matter of any of examples 1-5, and at least one sensor to output a measurement corresponding to at least one of the laser diode driver, the laser diode, or the at least one optical component, and wherein the processing device is configured to determine whether to select the group of the one or more commands based on the measurement.

Example 7 includes the subject matter of any of examples 1-6, and the processing device is configured to identify a desired optical output waveform different than an actual output waveform generatable from the single command, and wherein the group of the one or more commands corresponds to the desired optical output waveform.

Example 8 includes the subject matter of any of examples 1-7, and the group of the one or more commands are to pre-compensate for at least one of non-linear or non-ideal performance associated with at least one of the laser diode driver, the laser diode, or the at least one optical component to produce an actual output waveform that is closer to the desired optical output waveform than the actual output waveform generatable from the single command.

Example 9 includes the subject matter of any of examples 1-8, and the at least one optical component comprises wavelength conversion optics to receive input photons of a first wavelength and to output photons of a second different wavelength.

Example 10 includes the subject matter of any of examples 1-9, and the processing device is further configured to select the group of the one or more commands based on a response time of the laser diode driver.

Example 11 includes the subject matter of any of examples 1-10, and the laser diode driver includes: an AC (alternating current) to DC (direct current) power supply coupled to a reference voltage and to an anode of the laser diode; and current control loops coupled in parallel to a cathode of the laser diode, wherein each current control loop is coupled to the reference voltage for diode current control.

Example 12 includes the subject matter of any of examples 1-11, and the laser diode comprises a count of N diodes in series and a count of the current control loops is equal to N.

Example 13 includes the subject matter of any of examples 1-12, and each current control loop comprises a Field Effect Transistor (FET) including a first terminal, a second terminal, and a gate, and wherein the first terminals are electrically connected.

Example 14 includes the subject matter of any of examples 1-13, and each second terminal is coupled to the reference voltage through a sense resistor.

Example 15 includes the subject matter of any of examples 1-14, and terminals of each sense resistor are coupled to inputs of a first comparator, and an output of each first comparator is coupled to a first input terminal of a second comparator, and wherein outputs of the second comparators are coupled to the gates of the FETs, wherein second input terminals of the second comparators are electrically connected and coupled to an analog voltage to be determined by the processing device.

Example 16 is a method, comprising: receiving, at a laser system, an externally generated single command, wherein the single command is selected from a set of commands usable to control a laser diode driver of the laser system; determining, by the laser system, whether to select a group of one or more commands from the set of commands; and in response to a determination to select the group of the one or more commands from the set of commands, controlling the laser diode driver using the one or more commands of the group.

Example 17 includes the subject matter of example 16, and the group of the one or more commands includes only a single different command.

Example 18 includes the subject matter of any of examples 16-17, and the group of the one or more commands includes a sequence of commands, wherein a first command of the sequence is to be executed by the laser diode driver at a first time that is different than a second time that a second command of the sequence is to be executed by the laser diode driver.

Example 19 includes the subject matter of any of examples 16-18, and identifying a desired optical output waveform different than an actual output waveform generatable from the single command, wherein the sequence corresponds to the desired optical output waveform.

Example 20 includes the subject matter of any of examples 16-19, and one of the commands of the sequence is a same command as the single command.

Example 21 is a laser system, comprising: a laser diode; and a laser diode driver to control current into the laser diode, the laser diode driver comprising: an AC (alternating current) to DC (direct current) power supply coupled to a reference voltage and to an anode of the laser diode; and current control loops coupled in parallel to a cathode of the laser diode, wherein each current control loop is coupled to the reference voltage for diode current control.

Example 22 includes the subject matter of example 21, and the laser diode comprises a count of N diodes in series and a count of the current control loops is equal to N.

Example 23 includes the subject matter of any of examples 21-22, and each current control loop comprises a Field Effect Transistor (FET) including a first terminal, a second terminal, and a gate, and wherein the first terminals are electrically connected.

Example 24 includes the subject matter of any of examples 21-23, and each second terminal is coupled to the reference voltage through a sense resistor.

Example 25 includes the subject matter of any of examples 21-24, and terminals of each sense resistor are coupled to inputs of a first comparator, and an output of each first comparator is coupled to a first input terminal of a second comparator, and wherein outputs of the second comparators are coupled to the gates of the FETs, wherein second input terminals of the second comparators are electrically connected and coupled to an analog voltage to be determined by the processing device.

Most of the equipment discussed above comprises hardware and associated software. For example, a processing device may include one or more processors and software executable on those processors to carry out the operations described. We use the term software herein in its commonly understood sense to refer to programs or routines (subroutines, objects, plug-ins, etc.), as well as data, usable by a machine or processor. As is well known, computer programs generally comprise instructions that are stored in machine-readable or computer-readable storage media. Some embodiments of the present invention may include executable programs or instructions that are stored in machine-readable or computer-readable storage media, such as a digital memory. We do not imply that a "computer" in the conventional sense is required in any particular embodiment. For example, various processors, embedded or otherwise, may be used in equipment such as the components described herein.

Memory for storing software again is well known. In some embodiments, memory associated with a given processor may be stored in the same physical device as the processor ("on-board" memory); for example, RAM or FLASH memory disposed within an integrated circuit microprocessor or the like. In other examples, the memory comprises an independent device, such as an external disk drive, storage array, or portable FLASH key fob. In such cases, the memory becomes "associated" with the digital processor when the two are operatively coupled together, or in communication with each other, for example by an I/O port, network connection, etc. such that the processor can read a file stored on the memory. Associated memory may be "read only" by design (ROM) or by virtue of permission settings, or not. Other examples include but are not limited to WORM, EPROM, EEPROM, FLASH, etc. Those technologies often are implemented in solid state semiconductor devices. Other memories may comprise moving parts, such as a conventional rotating disk drive. All such memories are "machine readable" or "computer-readable" and may be used to store executable instructions for implementing the functions described herein.

A "software product" refers to a memory device in which a series of executable instructions are stored in a machine-readable form so that a suitable machine or processor, with appropriate access to the software product, can execute the instructions to carry out a process implemented by the instructions. Software products are sometimes used to distribute software. Any type of machine-readable memory, including without limitation those summarized above, may be used to make a software product. That said, it is also known that software can be distributed via electronic transmission ("download"), in which case there typically will be a corresponding software product at the transmitting end of the transmission, or the receiving end, or both.

In view of the many possible embodiments to which the principles of the disclosed technology may be applied, it should be recognized that the illustrated embodiments are only preferred examples and should not be taken as limiting the scope of the disclosure. I claim as my invention all that comes within the scope and spirit of the appended claims.

The invention claimed is:

1. An apparatus, comprising:
a laser diode driver to control current into a laser diode, the laser diode driver controllable using a set of commands;
a memory to store a model that is based on response characteristics associated with the commands of at least one of the laser diode driver, the laser diode, or at least one optical component to modify on an output of the laser diode; and
a processing device coupled to the laser diode driver and the memory, the processing device configured to:
receive a single command selected from the set of commands;
determine whether to select a group of one or more commands from the set of commands using the model and based on the single command; and
in response to a determination to select the group of the one or more commands from the set of commands, signal the laser diode driver using the one or more commands of the group.

2. The apparatus of claim 1, wherein the processing device is further configured to pass the single command to the laser diode driver in response to a determination to not select the group of the one or more commands.

3. The apparatus of claim 1, wherein the processing device is configured to signal the laser diode driver at a first time using a first command of the group, to wait an amount of time, and to signal the laser diode driver after waiting the amount of time at a second different time using a second command from the group.

4. The apparatus of claim 3, wherein the processing device is configured to select the amount of time using the model.

5. The apparatus of claim 4, wherein a source of the single command is a remote processing device of an application controller, wherein the remote processing device is external to the processing device of the application controller, and wherein the amount of time is no greater than a smallest amount of time that the remote processing device of the application controller is capable of delivering a next single command to the processing device.

6. The apparatus of claim 1, further comprising at least one sensor to output a measurement corresponding to at least one of the laser diode driver, the laser diode, or the at least one optical component, and wherein the processing device is configured to determine whether to select the group of the one or more commands based on the measurement.

7. The apparatus of claim 1, wherein the processing device is configured to identify a desired optical output waveform different than an actual output waveform generatable from the single command, and wherein the group of the one or more commands corresponds to the desired optical output waveform.

8. The apparatus of claim 7, wherein the group of the one or more commands are to pre-compensate for at least one of non-linear or non-ideal performance associated with at least one of the laser diode driver, the laser diode, or the at least one optical component to produce an actual output waveform that is closer to the desired optical output waveform than the actual output waveform generatable from the single command.

9. The apparatus of claim 1, wherein the at least one optical component comprises wavelength conversion optics to receive input photons of a first wavelength and to output photons of a second different wavelength.

10. The apparatus of claim 1, wherein the processing device is further configured to select the group of the one or more commands based on a response time of the laser diode driver.

11. The apparatus of claim 10, wherein the laser diode driver includes:
an AC (alternating current) to DC (direct current) power supply coupled to a reference voltage and to an anode of the laser diode; and
current control loops coupled in parallel to a cathode of the laser diode, wherein each current control loop is coupled to the reference voltage for diode current control.

12. The apparatus of claim 11, wherein the laser diode comprises a count of N diodes in series and a count of the current control loops is equal to N.

13. The apparatus of claim 11, wherein each current control loop comprises a Field Effect Transistor (FET) including a first terminal, a second terminal, and a gate, and wherein the first terminals are electrically connected.

14. The apparatus of claim 13, wherein each second terminal is coupled to the reference voltage through a sense resistor.

15. The apparatus of claim 14, wherein terminals of each sense resistor are coupled to inputs of a first comparator, and an output of each first comparator is coupled to a first input terminal of a second comparator, and wherein outputs of the second comparators are coupled to the gates of the FETs, wherein second input terminals of the second comparators are electrically connected and coupled to an analog voltage to be determined by the processing device.

16. A method, comprising:
receiving, at a laser system, an externally generated single command, wherein the single command is selected from a set of commands usable to control a laser diode driver of the laser system;
determining, by the laser system, whether to select a group of one or more commands from the set of commands using a model and based on the externally generated single command;
wherein the model is based on response characteristics associated with the commands of at least one of the laser diode driver, a laser diode corresponding to the laser diode driver, or at least one optical component to modify an output of the laser diode;
in response to a determination to select the group of the one or more commands from the set of commands, controlling the laser diode driver using the one or more commands of the group.

17. The method of claim 16, wherein the group of the one or more commands includes only a single different command.

18. The method of claim 16, wherein the group of the one or more commands includes a sequence of commands, wherein a first command of the sequence is to be executed by the laser diode driver at a first time that is different than a second time that a second command of the sequence is to be executed by the laser diode driver.

19. The method of claim 18, further comprising identifying a desired optical output waveform different than an actual output waveform generatable from the single command, wherein the sequence corresponds to the desired optical output waveform.

20. The method of claim 18, wherein one of the commands of the sequence is a same command as the single command.

21. A laser system, comprising:
a laser diode; and
a laser diode driver to control current into the laser diode, the laser diode driver comprising:
an AC (alternating current) to DC (direct current) power supply coupled to a reference voltage and to an anode of the laser diode; and
current control loops coupled in parallel to a cathode of the laser diode, wherein each current control loop is coupled to the reference voltage for laser diode current control.

22. The laser system of claim 21, wherein the laser diode comprises a count of N diodes in series and a count of the current control loops is equal to N.

23. The laser system of claim 21, wherein each current control loop comprises a Field Effect Transistor (FET) including a first terminal, a second terminal, and a gate, and wherein the first terminals are electrically connected.

24. The laser system of claim 23, wherein each second terminal is coupled to the reference voltage through a sense resistor.

25. The laser system of claim 24, wherein terminals of each sense resistor are coupled to inputs of a first comparator, and an output of each first comparator is coupled to a first input terminal of a second comparator, and wherein outputs of the second comparators are coupled to the gates of the FETs, wherein second input terminals of the second comparators are electrically connected and coupled to an analog voltage to be determined by the processing device.

* * * * *